United States Patent

Kamikawa et al.

Patent Number: 6,119,367
Date of Patent: Sep. 19, 2000

[54] SYSTEM FOR DRYING SEMICONDUCTOR WAFERS USING ULTRASONIC OR LOW FREQUENCY VIBRATION

[75] Inventors: Yuji Kamikawa, Kikuchi-gun; Satoshi Nakashima, Tamana-gun, both of Japan

[73] Assignee: Tokyo Electron Limited, Tokyo-To, Japan

[21] Appl. No.: 09/264,216

[22] Filed: Mar. 5, 1999

[30] Foreign Application Priority Data

Mar. 10, 1998 [JP] Japan ................................. 10-076522

[51] Int. Cl.$^7$ ........................................................ F26B 5/14
[52] U.S. Cl. ............................... 34/401; 34/179; 34/164
[58] Field of Search .............................. 34/164, 165, 179, 34/107, 401, 397, 398, 399, 400, 442, 443, 245

[56] References Cited

U.S. PATENT DOCUMENTS

| | | |
|---|---|---|
| 3,295,492 | 1/1967 | Schink ....................................... 118/48 |
| 3,710,450 | 1/1973 | Figiel ............................................. 34/9 |
| 5,012,593 | 5/1991 | Okada et al. ................................. 34/69 |
| 5,105,557 | 4/1992 | Vadasz et al. ............................... 34/14 |
| 5,778,485 | 7/1998 | Sano et al. ................................. 15/301 |

Primary Examiner—Stephen Gravini
Assistant Examiner—Michelle A. Mattera
Attorney, Agent, or Firm—Smith, Gambrell & Russell, LLP

[57] ABSTRACT

In order to remove water adhering to the surfaces of cleaned semiconductor wafers W, a vibration transmitting device 20 capable of approaching the surfaces of the semiconductor wafers W, and an oscillator 25 for applying an ultrasonic vibration to the vibration transmitting device 20. The oscillator 25 is driven to apply the ultrasonic vibration to the vibration transmitting plates 24 of the vibration transmitting device 20 and to apply energy of the ultrasonic vibration to a gas between the vibration transmitting device 20 and the surfaces of the semiconductor wafer W to remove water adhering the surfaces of the semiconductor wafers W. Thus, it is possible to surely remove water adhering to the surfaces of cleaned objects to be treated, to dry the objects without the need of a dry gas of an organic solvent vapor, such as IPA.

23 Claims, 10 Drawing Sheets

SYSTEM FOR DRYING SEMICONDUCTOR WAFERS USING ULTRASONIC OR LOW FREQUENCY VIBRATION

BACKGROUND OF THE INVENTION

1. Field of the Invention

The present invention relates generally to a drying system and a drying method. More specifically, the invention relates to a drying system and method for removing water adhering to the surface of a cleaned object to be treated, such as a semiconductor wafer or a glass substrate for a LCD.

2. Description of Related Background Art

Generally, in a process for producing semiconductor wafers or the like, there is widely adopted a cleaning method for subsequently immersing and cleaning objects to be treated, such as semiconductor wafers or glass substrates for LCDs (which will be hereinafter referred to as "wafers"), in a cleaning solution, such as a chemical or rinsing solution (pure water), stored in a processing bath.

In such a cleaning treatment, there are adopted (1) a so-called IPA drying method for contacting the surfaces of the cleaned wafers with a dry gas of a volatile organic solvent vapor, such as isopropyl alcohol (IPA) vapor, and for condensing or absorbing the vapor of the dry gas to remove water adhering to the surfaces of the wafers to dry the wafers, (2) a spin drier drying method for rotating wafers at high speed while maintaining the wafers in a horizontal state, and (3) a drying method for spraying a dry gas, e.g., nitrogen ($N_2$) gas, directly on the surfaces of the wafers to dry the wafers.

However, in the IPA drying method (1), it is feared that the treatment of IPA is in danger since IPA has a high volatility. In addition, since it is required to raise temperature to a high temperature to generate IPA vapor, there are problems in that attention must be paid to temperature control and a large-scale facility must be provided. In the spin drier drying method (2), since the wafers are rotated to utilize centrifugal force to dry the wafers, there is a problem in that water marks are easily made on the wafers to deteriorate the yields. In the drying method (3) for spraying a gas, such as $N_2$ gas, directly on the surfaces of the wafers, since $N_2$ gas is sprayed from the outside of the outer peripheries of the wafers, there is a problem in that the non-uniformity in drying is easily caused to deteriorate the yields.

SUMMARY OF THE INVENTION

It is therefore an object of the present invention to eliminate the aforementioned problems and to provide a drying system and method for surely removing water adhering to the surfaces of cleaned objects to be treated, to dry the objects without the need of a dry gas of an organic solvent vapor, such as IPA.

In order to accomplish the aforementioned and other objects, according to a first aspect of the present invention, there is provided a drying system for removing water adhering to a surface of a cleaned object to be treated, the drying system comprising: vibration transmitting means capable of approaching the surface of the object; and vibration generating means for applying an ultrasonic vibration or a low frequency vibration having a lower frequency than that of the ultrasonic vibration to the vibration transmitting means, the vibration generating means applying the ultrasonic vibration or the low frequency vibration to the vibration transmitting means, and applying energy of the ultrasonic vibration or the low frequency vibration to a gas between the vibration transmitting means and the surface of the object to remove water adhering to the surface of the object.

According to a second aspect of the present invention, there is provided a drying system for removing water adhering to surfaces of a plurality of cleaned objects to be treated, the drying system comprising: vibration transmitting means capable of approaching the surfaces of the plurality of objects; vibration generating means for applying an ultrasonic vibration or a low frequency vibration having a lower frequency than that of the ultrasonic vibration to the vibration transmitting means; holding means for holding the plurality of objects at regular intervals; and moving means for relatively moving the vibration transmitting means and the holding means, wherein while the moving means causes the surfaces of the plurality of objects to approach the vibration transmitting means, the vibration generating means applies the ultrasonic vibration or the low frequency vibration to the vibration transmitting means, and applies energy of the ultrasonic vibration or the low frequency vibration to a gas between the vibration transmitting means and the surfaces of the plurality of objects to remove water adhering to the surfaces of the plurality of objects.

According to a third aspect of the present invention, there is provided a drying system for removing water adhering to surfaces of a plurality of cleaned objects to be treated, the drying system comprising: vibration transmitting means arranged above a cleaning section for cleaning the plurality of objects, the vibration transmitting means being capable of approaching the surfaces of the plurality of objects pulled up from the cleaning section; vibration generating means for applying an ultrasonic vibration or a low frequency vibration having a lower frequency than that of the ultrasonic vibration to the vibration transmitting means; holding means for holding the plurality of objects at regular intervals; and moving means for relatively moving the vibration transmitting means and the holding means so that the plurality of objects pass through the vibration transmitting means, wherein when the moving means pulls the plurality of objects up from the cleaning section to cause the plurality of objects to pass through the vibration transmitting means, the vibration generating means applies the ultrasonic vibration or the low frequency vibration to the vibration transmitting means, and applies energy of the ultrasonic vibration or the low frequency vibration to a gas between the vibration transmitting means and the surfaces of the plurality of objects to remove water adhering to the surfaces of the plurality of objects.

According to a fourth aspect of the present invention, there is provided a drying system for removing water adhering to surfaces of a plurality of cleaned objects to be treated, the drying system comprising: vibration transmitting means capable of approaching the surfaces of the plurality of objects; vibration generating means for applying an ultrasonic vibration or a low frequency vibration having a lower frequency than that of the ultrasonic vibration to the vibration transmitting means; holding means for holding the plurality of objects at regular intervals; moving means for relatively moving the vibration transmitting means and the holding means so that the plurality of objects pass through the vibration transmitting means; grabbing means for grabbing the plurality of objects which have been passed through the vibration transmitting means; and discharging means for receiving the plurality of objects from the grabbing means to discharge the plurality of objects to a predetermined place, wherein when the moving means causes the plurality of objects to pass through the vibration transmitting means, the vibration generating means applies the ultrasonic vibration or the low frequency vibration to the vibration transmitting means, and applies energy of the ultrasonic vibration or the low frequency vibration to a gas between the vibration transmitting means and the surfaces of the plurality of objects to remove water adhering to the surfaces of the plurality of objects.

According to a fifth aspect of the present invention, the drying system, according to any one of the first through fourth aspect of the present invention, further comprises gas supply means for supplying a gas to spaces between the objects and the vibration transmitting means, the vibration generating means applying the ultrasonic vibration or the low frequency vibration to the vibration transmitting means, and applying energy of the ultrasonic vibration or the low frequency vibration to a gas supplied by the gas supply means to the spaces between the vibration transmitting means and the surfaces of the objects to remove water adhering to the surfaces of the objects.

According to a sixth aspect of the present invention, the drying system, according to any one of the first through fourth aspect of the present invention, further comprises: gas supply means for supplying a gas to spaces between the objects and the vibration transmitting means, and exhaust means having an exhaust port at a position at which the object approaches the vibration transmitting means, the vibration generating means applying the ultrasonic vibration or the low frequency vibration to the vibration transmitting means, and applying energy of the ultrasonic vibration or the low frequency vibration to a gas supplied by the gas supply means to the spaces between the vibration transmitting means and the surfaces of the objects to remove water adhering to the surfaces of the objects and to exhaust the gas containing water removed by the exhaust means.

The drying system, according to the third or fourth aspect of the present invention, may further comprise delivering means for delivering the objects to the holding means, the delivering means having a space adjusting mechanism for adjusting the spaces between the objects. In the drying system according to the fourth aspect of the present invention, the grabbing means may have a space adjusting mechanism for adjusting the spaces between the objects.

The drying system according to the fifth aspect of the present invention, may further comprise heating means for heating the gas supplied from the gas supply means, the gas heated by the heating means being supplied to the spaces between the object and the vibration transmitting means.

In the drying system according to the fifth aspect of the present invention, the vibration transmitting means may have a gas supply port for the gas supplying means.

In the drying system according to the sixth aspect of the present invention, the vibration transmitting means may have a pair of vibration transmitting members arranged between the objects, each of the vibration transmitting members having an inclined surface on the side opposite the objects so that the inclined surface extending toward the tip thereof is inclined toward the corresponding one of the objects, and an exhaust port communicating with the exhaust means being formed between the adjacent vibration transmitting members.

According to a seventh aspect of the present invention, there is provided a drying method for removing water adhering to a surface of a cleaned object to be treated, wherein energy of an ultrasonic vibration or a low frequency vibration having a lower frequency than that of the ultrasonic vibration is applied to a gas near the surface of the object to remove water adhering to the surface of the object.

According to an eighth aspect of the present invention, there is provided a drying method comprising the step of: immersing an object to be treated, in a cleaning solution; relatively pulling the object up from the cleaning solution; applying energy of an ultrasonic vibration or a low frequency vibration having a lower frequency than that of the ultrasonic vibration to a gas near the surface of the object to remove water adhering to the surface of the object.

According to a ninth aspect of the present invention, in the drying method according to the seventh or eighth aspect of the present invention, the gas is supplied toward the surface of the object, and the energy of the ultrasonic vibration or the low frequency vibration is applied to the gas to remove water adhering to the surface of the object.

In this drying method, the gas may be sprayed toward a liquid surface on the object pulled up from a cleaning solution.

According to a tenth aspect of the present invention, the drying method, according to the seventh or eighth aspect of the present invention, further comprises the steps of: inserting vibration transmitting means into spaces between the cleaned objects; and applying energy of the ultrasonic or low frequency vibration to a gas by the vibration of the vibration transmitting means to remove water adhering to the surfaces of the objects.

According to an eleventh aspect of the present invention, the drying method, according to the seventh or eighth aspect of the present invention, further comprises the steps of: inserting vibration transmitting means into spaces between the cleaned objects; supplying a gas to spaces between the objects and the vibration transmitting means; and applying energy of the ultrasonic or low frequency vibration to the gas by the vibration of the vibration transmitting means to remove water adhering to the surfaces of the objects.

According to a twelfth aspect of the present invention, the drying method, according to the seventh or eighth aspect of the present invention, further comprises the steps of: inserting vibration transmitting means into spaces between the cleaned objects; supplying a gas to spaces between the objects and the vibration transmitting means; applying energy of the ultrasonic or low frequency vibration to the gas by the vibration of the vibration transmitting means to remove water adhering to the surfaces of the objects; and exhausting the gas containing water removed from the objects.

According to a thirteenth aspect of the present invention, there is provided a drying method for removing water adhering to surfaces of a plurality of cleaned objects to be treated, the drying method comprising the steps of: expanding spaces between the plurality of cleaned objects to be treated, to predetermined spaces; inserting vibration transmitting means into the spaces between the cleaned objects; supplying a gas to spaces between the objects and vibration transmitting means; and applying energy of an ultrasonic vibration or a low frequency vibration having a lower frequency than that of the ultrasonic vibration to the gas by the vibration of the vibration transmitting means to remove water adhering to the surfaces of the objects.

According to a fourteenth aspect of the present invention, there is provided a drying method for removing water adhering to surfaces of a plurality of cleaned objects to be treated, the drying method comprising the steps of: expanding spaces between the plurality of cleaned objects to be treated, to predetermined spaces; inserting vibration transmitting means into the spaces between the cleaned objects; supplying a gas to spaces between the objects and vibration transmitting means; applying energy of an ultrasonic vibration or a low frequency vibration having a lower frequency than that of the ultrasonic vibration to the gas by the vibration of the vibration transmitting means to remove water adhering to the surfaces of the objects; and exhausting the gas containing water removed from the objects.

According to a fifteenth aspect of the present invention, there is provided a drying method for removing water adhering to surfaces of a plurality of cleaned objects to be treated, the drying method comprising the steps of: expanding spaces between the plurality of cleaned objects to be treated, to predetermined spaces; passing the objects through vibration transmitting means to position the vibration transmitting means between the plurality of objects; supplying a gas to spaces between the objects and the vibration transmitting means when the objects pass through the vibration transmitting means; applying energy of an ultrasonic vibration or a low frequency vibration having a lower frequency than that of the ultrasonic vibration to the gas by the vibration of the vibration transmitting means to remove water adhering to the surfaces of the objects; exhausting the gas containing water removed from the objects; grabbing the plurality of objects, from which water has been removed and which have been dried, and narrowing spaces between the plurality of objects to predetermined spaces; and discharging the plurality of objects, the spaces between the objects having been narrowed.

In the drying method according to any one of the seventh, eighth, thirteenth, fourteenth and fifteenth aspects of the present invention, the gas may be a gas heated to a predetermined temperature.

In accordance with the drying system or method according to the first or seventh aspect of the present invention, it is possible to remove water adhering to the surfaces of cleaned objects to be treated, to dry the objects by applying ultrasonic or low frequency vibrational energy to a gas in vicinity of the surfaces of the cleaned objects.

In accordance with the drying system according to the eighth aspect of the present invention, it is possible to remove water adhering to the surfaces of objects to be treated, to dry the objects by applying an ultrasonic or low frequency vibration to vibration transmitting means using vibration generating means and by applying ultrasonic or low frequency vibrational energy to a gas between the vibration transmitting means and the surfaces of the objects while moving means causes the surfaces of the objects to approach the vibration transmitting means.

In accordance with the drying system according to the third or fourth aspect of the present invention or the drying method according to the eighth or tenth aspect of the present invention, it is possible to remove water adhering to the surfaces of objects to be treated, to dry the objects by applying an ultrasonic or low frequency vibration to a vibration transmitting means using vibration generating means and by applying ultrasonic or low frequency vibrational energy to a gas between the vibration transmitting means and the surfaces of the objects when the objects, which have been immersed in a cleaning solution to be cleaned, are pulled up from the cleaning solution.

In accordance with the drying system according to the fifth or sixth aspect of the present invention or the drying method according to the ninth or eleventh aspect of the present invention, it is possible to remove water adhering to the surfaces of objects to be treated, by applying ultrasonic or low frequency vibrational energy to a gas which is positively supplied toward the surfaces of the objects. In this case, since it is possible to remove water so as to peel off the surfaces of the objects by spraying the gas toward the liquid surfaces on the objects pulled up from a cleaning solution, it is possible to more surely remove water adhering to the surfaces of the objects.

In accordance with the drying system according to the sixth aspect of the present invention or the drying method according to the twelfth aspect of the present invention, it is possible to prevent the removed water from adhering to the objects again by exhausting the gas containing the removed water using exhaust means.

In addition, it is possible to adjust spaces between a plurality of objects to be treated, to cause vibration transmitting means to enter and approach the spaces between the objects by providing a space adjusting mechanism for adjusting the spaces between the objects on receiving means provided on holding means or on grabbing means, so that it is possible to simultaneously dry the plurality of objects.

In addition, it is possible to remove water adhering to the surfaces of objects to be treated, by supplying a gas, which has been heated by heating means, to spaces between the objects and vibration transmitting means and by applying ultrasonic or low frequency vibrational energy to the heated gas, so that it is possible to more improve drying efficiency.

In addition, the vibration transmitting means can be integrally formed with the supply port of the air supply means by providing the supply port of the air supplying means on the vibration transmitting means. Therefore, it is possible to positively supply the gas toward the surfaces of the objects and it is possible to reduce the size of the system.

Moreover, if the vibration transmitting means has a pair of vibration transmitting members arranged between objects to be treated, each of the vibration transmitting members having an inclined surface on the side opposite the object so that the inclined surface extending toward the end thereof is inclined toward the object, and if exhaust ports communicating with exhaust means are formed between the adjacent vibration transmitting members, it is possible to integrally form the vibration transmitting means and the exhaust ports of the exhaust means. Therefore, it is possible to quickly exhaust the gas containing the removed water and it is possible to reduce the size of the system.

In accordance with the drying method according to the thirteenth aspect of the present invention, the spaces between the adjacent two of a plurality of cleaned objects to be treated are expanded to predetermined spaces to insert vibration transmitting means into the spaces between the objects to supply a gas to the spaces between the objects and the vibration transmitting means, and ultrasonic or low frequency vibrational energy is applied to the gas by the vibration of the vibration transmitting means to remove water adhering to the surface of the objects, so that it is possible to remove water adhering to the surfaces of the plurality of objects by applying the ultrasonic or low frequency vibrational energy to the supplied gas while ensuring the spaces for receiving the vibration transmitting means between the plurality of objects.

In accordance with the drying method according to the fourteenth aspect of the present invention, similar to the drying method according to thirteenth aspect of the present invention, it is possible to prevent the removed water from adhering to the objects again by exhausting the gas containing the removed water after removing water adhering to the surface of the object.

In accordance with the drying method according to the fifteenth aspect of the present invention, the spaces between the adjacent two of a plurality of cleaned objects to be treated are expanded to predetermined spaces to move the objects so that vibration transmitting means are positioned between the plurality of objects, and a gas is supplied to the spaces between the objects and the vibration transmitting means and ultrasonic or low frequency vibrational energy is applied to the gas by the vibration of the vibration transmitting means, so that it is possible to remove water adhering to the surfaces of the objects and it is possible to exhaust the gas containing the removed water. Moreover, after the plurality of objects, from which water has been removed and which have been dried, are clamped and the spaces between the objects are narrowed to predetermined spaces, it is possible to discharge the objects to a predetermined place.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below. The case where a drying system and a drying method according to the present invention are applied to a system for cleaning and drying semiconductor wafers (objects to be treated) will be described below.

Figure 1:
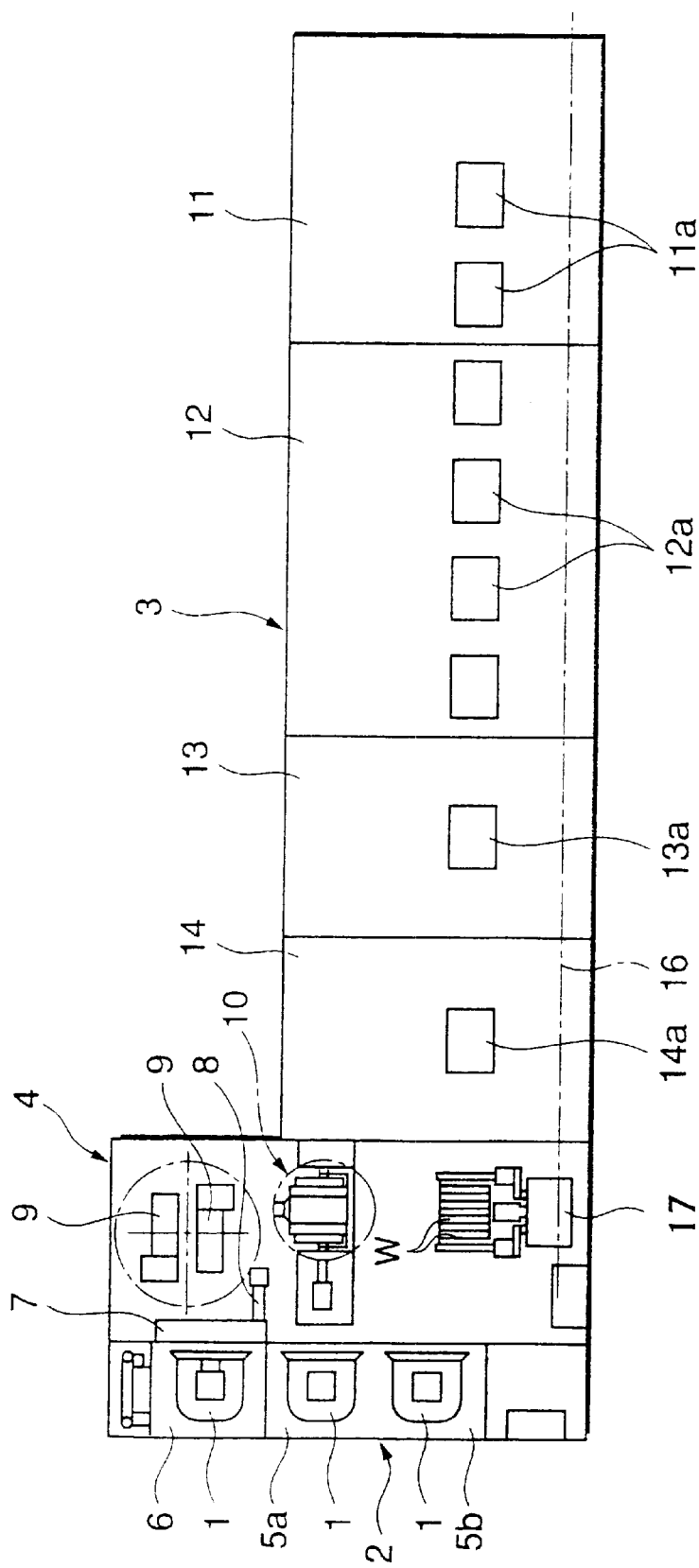
FIG. 1 is a schematic plan view of an example of a semiconductor wafer cleaning system, to which a drying system according to the present invention is applied.

As shown in FIG. 1, the cleaning system mainly comprises an introducing/discharging section 2 for introducing and discharging a container, e.g. a carrier 1, which is capable of horizontally housing therein objects to be treated, e.g., semiconductor wafers (which will be hereinafter referred to as "wafers") W; a treatment section 3 for liquid-treating the wafers W with a chemical, a cleaning solution and so forth and for drying the wafers W; and a delivery section, e.g., an interface section 4, arranged between the introducing/discharging section 2 and the treatment section 3, for delivering, positioning, attitude-changing and space adjusting the wafers W.

The introducing/discharging section 2 has a carrier introducing part 5a, a carrier discharging part 5b and a wafer introducing/discharging part 6 on the side of one end of the cleaning system. Between the carrier introducing part 5a and the wafer introducing/discharging part 6, a transport mechanism (not shown) is provided. This transport mechanism is designed to transport the carrier 1 from the carrier introducing part 5a to the wafer introducing/discharging part 6.

The treatment section 3 comprises: a first treatment section 11 having a first treatment unit 11a for removing particles and organic contaminants adhering to the wafers W; a second treatment section 12 having a second treatment unit 12a for removing metallic contaminants adhering to the wafers W; a third treatment section 13 having a cleaning/drying unit 13a for removing oxide films adhering to the wafers W and for drying the wafers W, the cleaning/drying unit 13a including a drying system according to the present invention; and a fourth treatment section 14 having a chuck cleaning/drying unit 14a for cleaning and drying a wafer transport chuck 17 which will be described later. Furthermore, it is not always required to arrange the fourth treatment section 14 between the third treatment section 13 and the interface section 4. For example, the fourth treatment section 14 may be arranged between the second treatment section 12 and the third treatment section 13, or adjacent to the first treatment section 11.

In each of the carrier discharging part 5b and the wafer introducing/discharging part 6, a carrier lifter (not shown) is provided. The carrier lifter is designed to deliver empty carriers 1 to a carrier waiting part (not shown) provided above the introducing/discharging section 2 and to receive the empty carriers 1 from the carrier waiting part. The carrier waiting part is provided with a carrier transport robot (not shown) which is movable in horizontal directions (X, Y directions) and vertical directions (Z directions). The carrier transport robot is designed to align the empty carriers 1 transported from the wafer introducing/discharging part 6, and to discharge the empty carriers 1 to the carrier discharging part 5b. In the carrier waiting part, the empty carriers are not only wait, but carriers 1 housing therein the wafers W may also wait.

The carrier 1 comprises; a container body (not shown), which has an opening (not shown) formed on one side thereof, and holding grooves (not shown) formed in the inner wall thereof for horizontally holding a plurality of wafers W, e.g., 25 wafers W, at regular intervals; and a lid (not shown) for opening and closing the opening of the container body. The lid is designed to be open and closed by a lid opening/closing mechanism 7 which will be described later.

The wafer introducing/discharging part 6 is open to the interface section 4, and the lid opening/closing unit 7 is provided in the opening between the water introducing/discharging part 6 and the interface section 4. By the lid opening/closing unit 7, a lid (not shown) of the carrier 1 is open and closed. Therefore, the lid of a carrier 1, which has been transported to the wafer introducing/discharging part 6 and which houses therein untreated wafers W, can be removed by the lid opening/closing unit 7 to allow the wafers W in the carrier 1 to be discharged, and the lid can be closed by the lid opening/closing unit 7 again after all of the wafers W are discharged. In addition, the lid of an empty carrier 1, which has been transported from the carrier waiting part to the wafer introducing/discharging part 6, can be removed by the lid opening/closing unit 7 to allow the wafers W to be introduced into the carrier 1, and the lid can be closed by the lid opening/closing unit 7 again after all of the wafers W are introduced. Furthermore, in the vicinity of the opening of the wafer introducing/discharging part 6, a mapping sensor 8 for detecting the number of wafers W housed in the carrier 1 is provided.

The interface section 4 has: a wafer transport arm 9 for holding a plurality of wafers, e.g., 25 wafers W, in a horizontal state and for delivering the wafers W in the horizontal state from and to the carrier 1 of the wafer introducing/discharging part 6; space adjusting means, e.g., a pitch changer (not shown), for holding a plurality of wafers, e.g., 50 wafers W, in a vertical state at regular intervals; holding means, e.g., an attitude changing unit 10, arranged between the wafer transport arm 9 and the pitch changer, for changing the attitude of the plurality of wafers, e.g., the 25 wafers W, from the horizontal state to the vertical state or from the vertical state to the horizontal state; and position detecting means, e.g., a notch aligner (not shown), for detecting a notch (not shown) formed in each of the wafers W, the attitude of which has been changed to the vertical state. The interface section 4 is provided with a transport channel 16 communicating with the treatment section 3. On the transport channel 16, a wafer transport chuck 15 is movably provided for holding and transporting the wafers W to deliver the wafers W to any one of the first through third treatment units 11a through 13a.

The drying system according to the present invention will be described below.

First Preferred Embodiment

Figure 2:
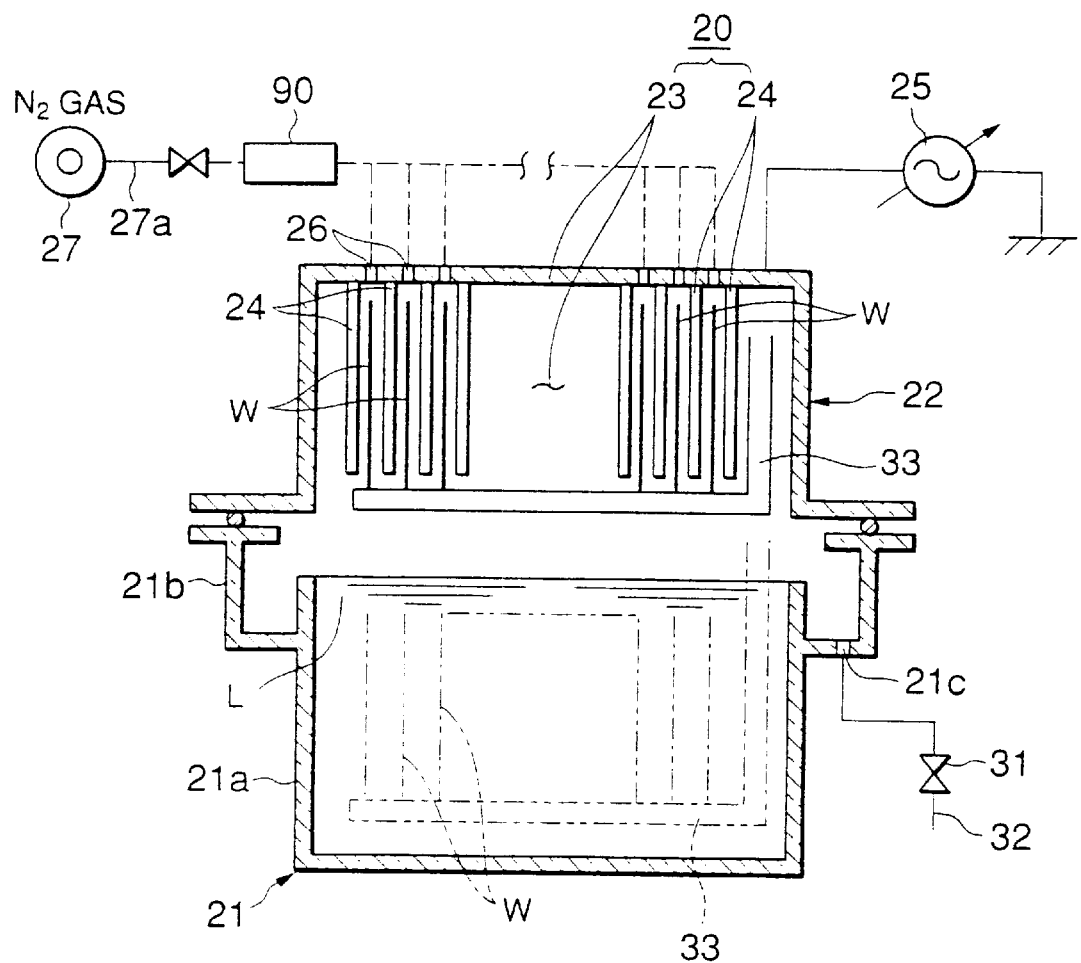
FIG. 2 is a schematic sectional view of the first preferred embodiment of a drying system according to the present invention.
Figure 3:
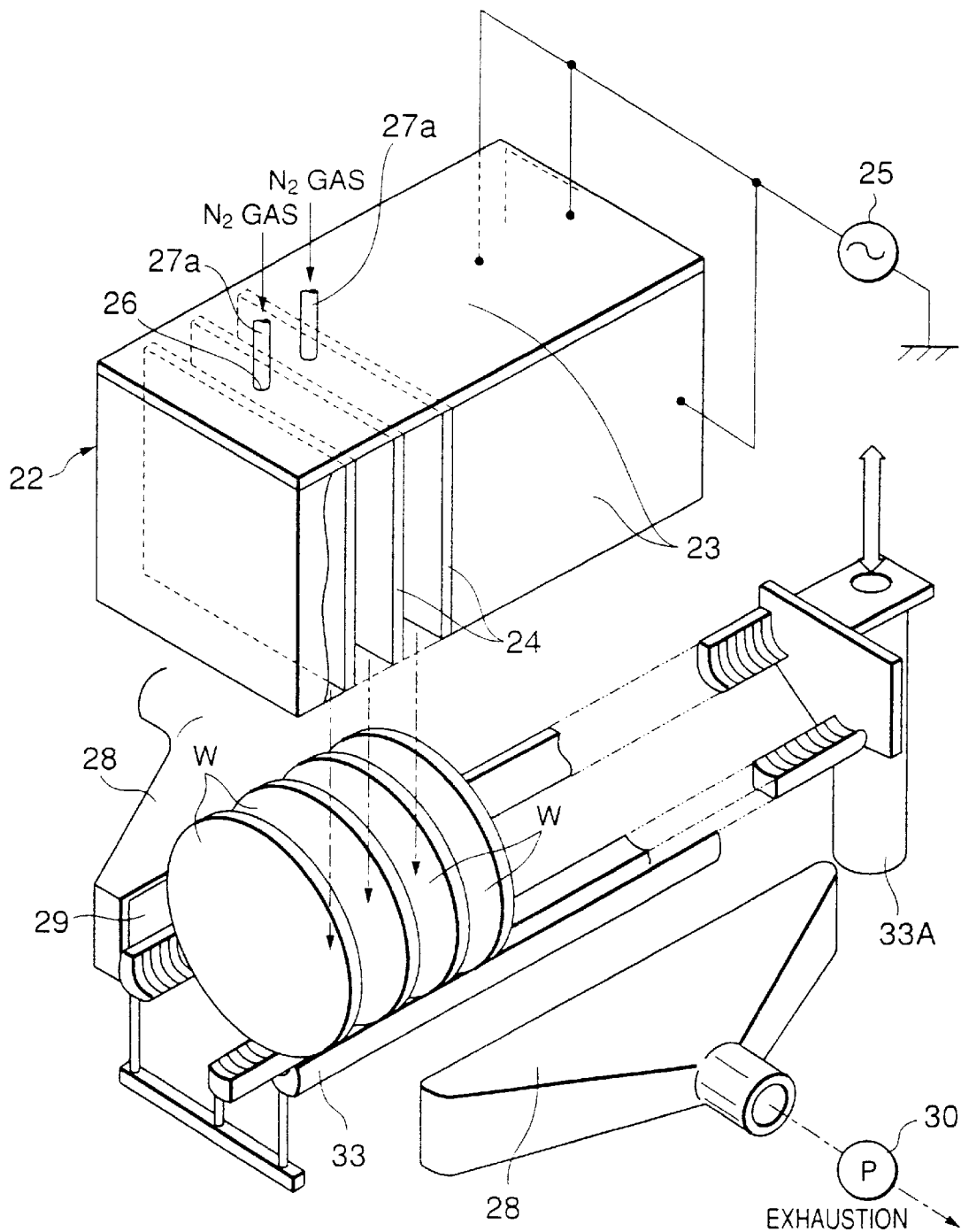
FIG. 3 is an exploded perspective view of a principal part of the first preferred embodiment of a drying system according to the present invention.

FIG. 2 is a schematic sectional view of the first preferred embodiment of a drying system according to the present invention, and FIG. 3 is a schematic perspective view of a principal part thereof.

The drying system comprises: a treatment bath 21 for storing therein a cleaning solution L, in which objects to be treated, e.g., semiconductor wafers (which will be hereinafter referred to as "wafers") W, are immersed to be treated; a box-shaped lid 22 provided on the top of the treatment bath 21; and vibration transmitting means 20 incorporated in the lid 22. Furthermore, the lid 22 is designed to open and close the opening of the treatment bath 21 by opening/closing moving means (not shown).

The vibration transmitting means 20 comprises: ultrasonic vibration elements 23 forming the top surface and right and left facing side surfaces of the lid 22, which are formed of plates of quartz; and a plurality of vibration transmitting members, e.g., substantially rectangular vibration transmitting plates 24 of stainless steel, which are arranged in the three ultrasonic vibration elements 23 at suitable intervals. To the ultrasonic vibration elements 23, vibration generating means, e.g., an oscillator 25 with an oscillation source and a power supply unit, is connected. When the oscillator 25 is driven, the ultrasonic vibration elements 23 generate an ultrasonic vibration of a suitable frequency to transmit the ultrasonic vibration to the vibration transmitting plates 24. The oscillating frequency of the oscillator 25 is variable, and selected so as to most efficiently remove the cleaning solution adhering to the wafers W in accordance with the kind of the cleaning solution.

Supply ports 26 are formed in the top surface of the lid 22, i.e., in the ultrasonic vibration element 23 between the adjacent vibration transmitting plates 24. A gas supply source, e.g., a nitrogen ($N_2$) gas supply source 27, is connected to the supply ports 26 via a gas supply pipe 27a to supply $N_2$ gas to spaces between the vibration transmitting plates 24 of the lid 22. Heating means, e.g., a heater 90, is provided in the gas supply pipe 27a to heat $N_2$ gas, which is used for drying, to a predetermined temperature, e.g., 40° C.

An exhaust port 29 of an exhaust duct 28 is provided outside of the lid 22 to exhaust gas via the exhaust port 29 by driving exhaust means, e.g., a suction pump 30, which is connected to the exhaust duct 28.

The treatment bath 21 comprises: an inner bath 21a for storing therein the cleaning solution L to immerse the wafers W therein; and an outer bath 21b surrounding the opening of the inner bath 21a for receiving the cleaning solution L overflowing the inner bath 21a. The cleaning solution L is supplied to the inner bath 21a from a cleaning solution supply source (not shown). The outer bath 21b has a discharge port 21c in the bottom thereof. A drain pipe 32, in which a drain valve 31 is provided, is connected to the discharge port 21c. Holding means, e.g., a wafer guide 33, for holding a plurality of wafers, e.g., 50 wafers W, is provided in the inner bath 21a so as to be vertically movable by moving means, e.g., an air cylinder 33A.

A method for drying wafers W by means of the drying system with the above construction will be described below.

First, after the wafers W are immersed and cleaned in the cleaning solution L in the treatment bath 21 (specifically in the inner bath 21a), the wafer guide 33 is moved upwards to position the wafers W between the vibration transmitting plates 24 of the vibration transmitting means 20.

Then, the oscillator 25 is driven to cause the ultrasonic vibration elements 23 to generate and transmit ultrasonic vibrations to the vibration transmitting plates 24, and $N_2$ gas is supplied from the $N_2$ gas supply source 27 to spaces between the surfaces of the wafers W and the vibration transmitting plates 24 to apply ultrasonic vibrational energy to the $N_2$ gas to remove water, i.e., droplets of the cleaning solution, which adheres to the surfaces of the wafers W. At this time, if the $N_2$ gas supplied from the $N_2$ gas supply source 27 is heated by the heater 90, the heated $N_2$ gas can be supplied to the surfaces of the wafers W, so that it is possible to more improve drying efficiency. During this drying, the suction pump 30 is driven to exhaust $N_2$ gas containing water, i.e., the droplets of the cleaning solution, which have been removed from the surfaces of the wafers W, from both of the facing exhaust ports 29 to the outside.

As described above, since $N_2$ gas can be sprayed on the whole surfaces of the wafers W by supplying the $N_2$ gas to the spaces between the surfaces of the wafers W and the vibration transmitting plates 24 and applying ultrasonic vibrational energy to the $N_2$ gas, the droplets of the cleaning solution adhering to the surfaces of the wafers W can be surely removed to dry the wafers W. In addition, since the $N_2$ gas containing the droplets removed from the surfaces of the wafers W is exhausted to the outside via the exhaust ports 29, the droplets do not adhere to the surfaces of the wafers W again.

Thus, after the droplets adhering to the surfaces of the wafers W are removed to dry the wafers W, the lid 22 is retracted upwards by moving means (not shown). Thereafter, the wafer transport chuck 15 receives the wafers W to transport the wafers W to the interface section 4.

While the ultrasonic vibration transmitting member has been formed of a substantially rectangular plate of stainless steel, the ultrasonic vibration transmitting member need not necessarily be formed of a substantially rectangular plate. The ultrasonic vibration transmitting member may have an optional shape if it can apply an ultrasonic vibration so as to spray a gas, e.g., $N_2$ gas, to at least the entire surface areas of the wafers W. For example, the ultrasonic vibration transmitting member may be circle, which is the same shape as that of the wafer W, semicircle, strip-shaped or wire-shaped. While the ultrasonic vibration transmitting means 20 has been mounted on the lid 22 for closing the opening of the treatment bath 21, the ultrasonic vibration transmitting means 20 need not necessarily be mounted on the lid 22, but it may be provided on the top of the treatment system so as to be arranged in vicinity of the wafers W when the wafer guide 33 moves upwards to pull the wafers W up from the cleaning solution L in the treatment bath 21.

While the gas has been $N_2$ gas, an inert gas other than $N_2$ or cleaned air may be used. Alternatively, ultrasonic vibrational energy may be applied to a gas, e.g., air, between the wafers W and the vibration transmitting plates 24 without the need of the gas supply source to remove water, e.g., the droplets of the cleaning solution, adhering to the surfaces of the wafers W.

Second Preferred Embodiment

Figure 4:
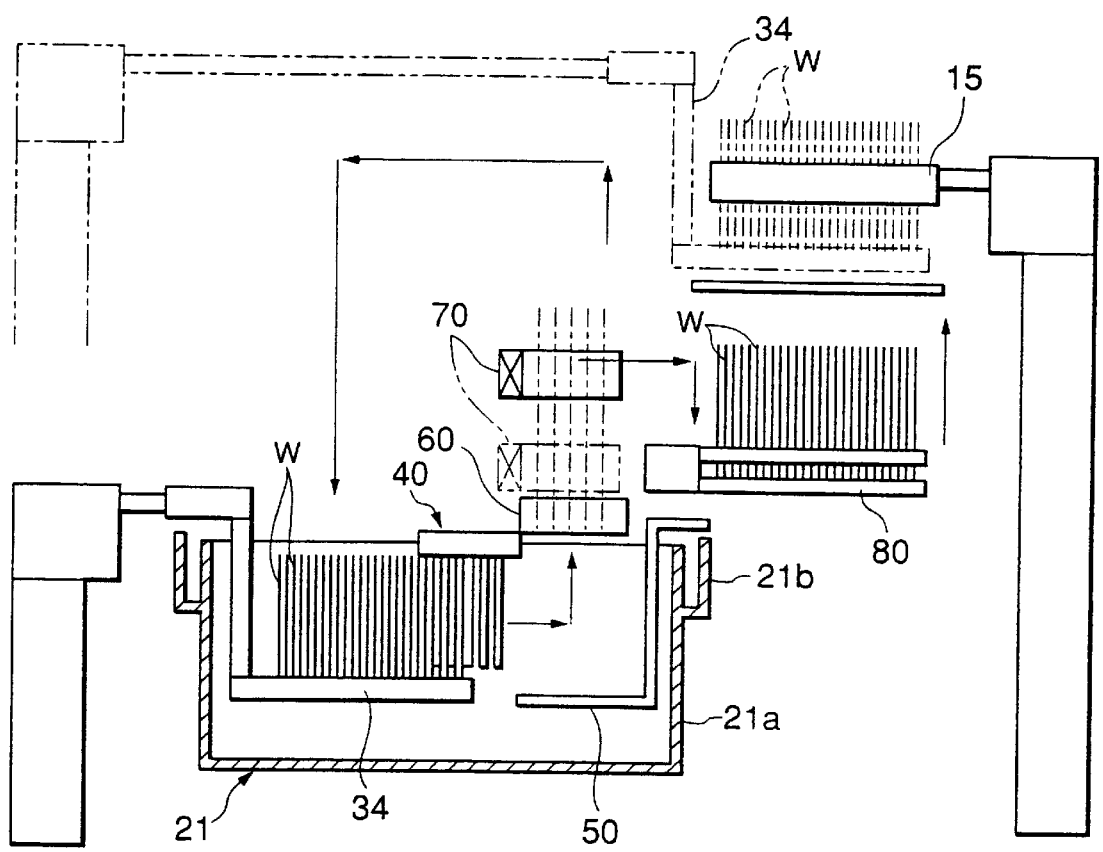
FIG. 4 is a schematic sectional view of the second preferred embodiment of a drying system according to the present invention.

FIG. 4 is a schematic sectional view of the second preferred embodiment of a drying system according to the present invention.

In the second preferred embodiment, a plurality of wafers, e.g., 50 wafers W, which have been introduced into the treatment section 3 to be cleaned, are subsequently dried to be discharged.

That is, in the second preferred embodiment, the drying system comprises: a wafer transport guide 34 for receiving the wafers W from a wafer transport arm 15 to immerse the wafers W in a cleaning solution L stored in a treatment bath 21 (specifically in an inner bath 21a); delivery means, e.g., a pickup pincette 40, for receiving an appropriate number of wafers, e.g., 5 wafers W, from the wafer transport guide 34 and for expanding the spaces between the wafers W to deliver the wafers W to holding means which will be described later; holding means, e.g., a lift guide 50, for holding the wafers W, the spaces between the wafers W having been expanded by the pickup pincette 40, and for moving the held wafers W above the treatment bath 21; vibration transmitting means 60, arranged above the treatment bath 21, for drying the 5 wafers W pulled up by the lift guide 50 from the cleaning solution L stored in the treatment bath 21; grabbing means, e.g., a receiving pincette 70, for receiving the wafers W dried by the vibration transmitting means 60 and for narrowing the spaces between the adjacent wafers W to the original spaces; and a wafer transport guide 80 for delivering the wafers W to the wafer transport arm 15 after receiving a predetermined number of wafers, e.g., 50 wafers W, which have been received by the receiving pincette 70.

Figure 5:
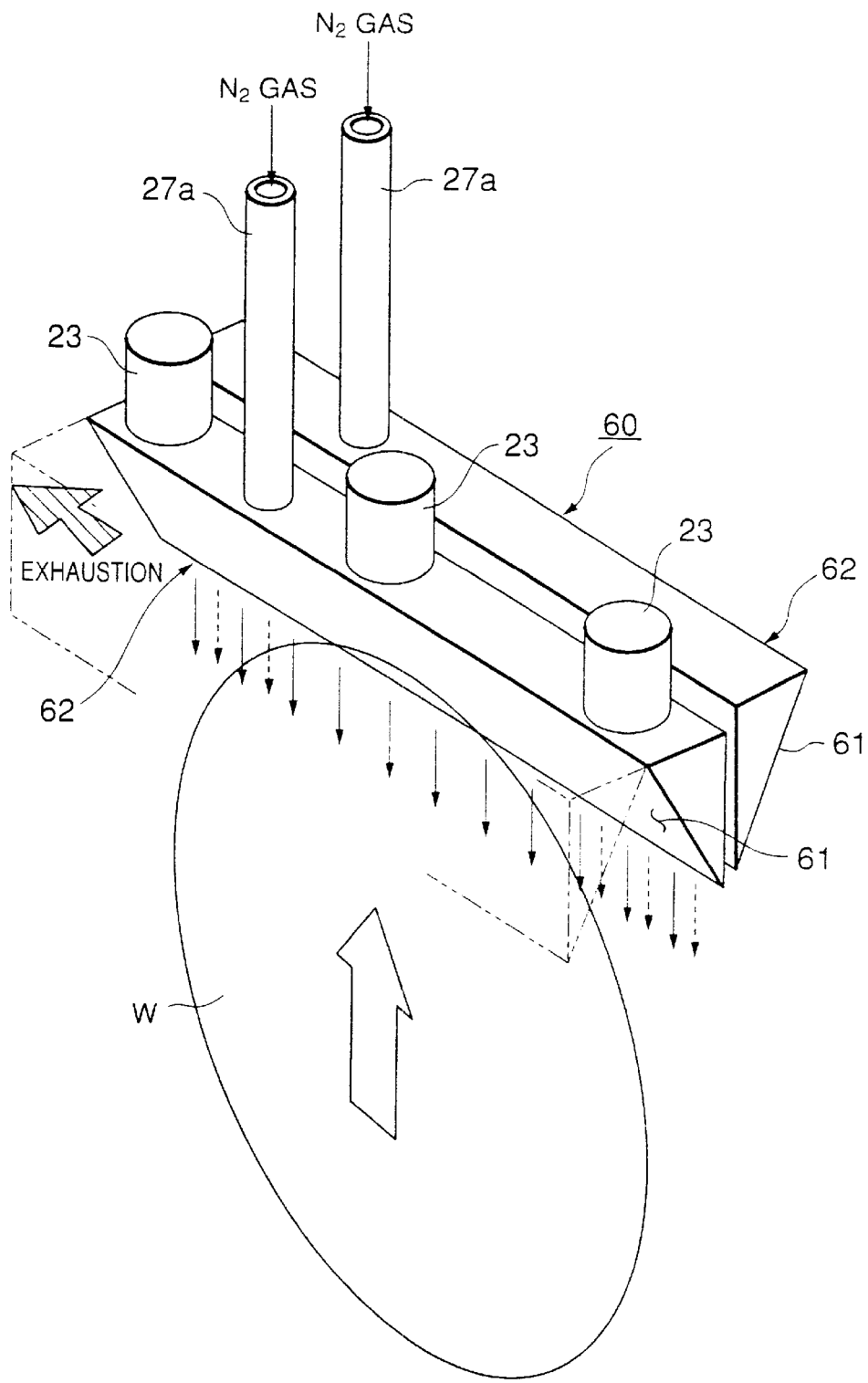
FIG. 5 is a schematic perspective view of vibration transmitting means of the second preferred embodiment of a drying system according to the present invention.
Figure 6:
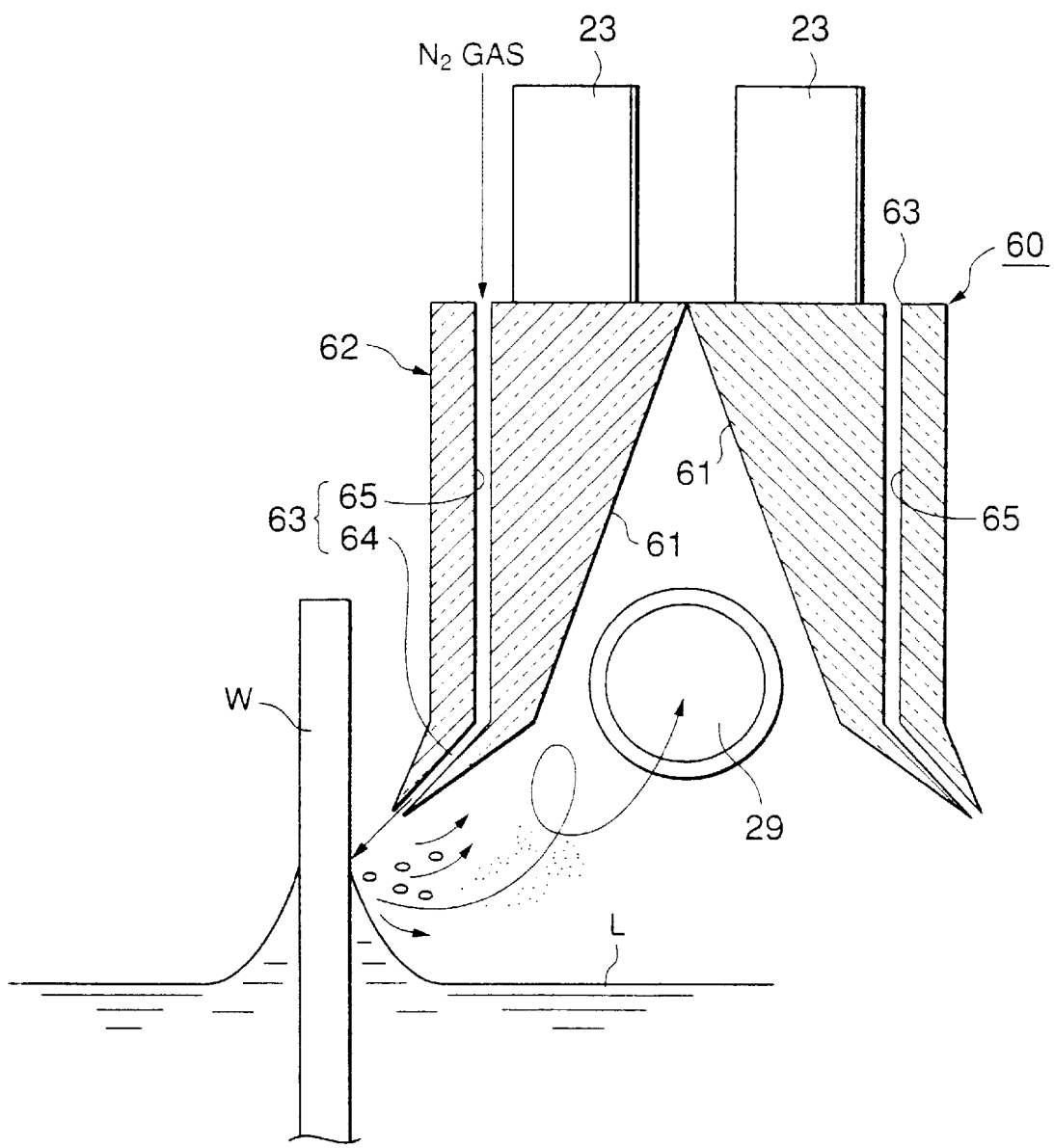
FIG. 6 is a sectional view of a principal part of the vibration transmitting means in the second preferred embodiment.

As shown in FIGS. 5 and 6, the vibration transmitting means 60 has vibration transmitting members 62 of quartz, each of which has an inclined surface 61 on the side opposite the wafer W pulled up from the treatment bath 21 so that the inclined surface 61 extending toward the lower end thereof is inclined toward the wafer W. An exhaust port 29 communicating with exhaust means, e.g., a suction pump (not shown), is formed between the adjacent vibration transmitting members 62. Each of the vibration transmitting members 62 has a gas supply port 63, which is connected to a gas supply source, e.g., an $N_2$ gas supply source (not shown), on the side of the wafer W. The gas supply port 63 comprises: a slit nozzle 64, which is bent toward the wafer W from the tip of the vibration transmitting member 62; and a gas passage 65 for connecting the slit nozzle 64 to a gas supply pipe 27a. An ultrasonic vibration element 23 of quartz connected to an oscillator (not shown) is mounted on the top of the vibration transmitting member 62. Furthermore, similar to the first preferred embodiment, heating means, e.g., a heater (not shown), is provided in the gas supply pipe 27a.

In the vibration transmitting means 60 with the above described construction, if the oscillator is driven and a gas, e.g., $N_2$ gas, is supplied from the $N_2$ gas supply source, ultrasonic vibrational energy is applied to the $N_2$ gas flowing through the gas passage 65 from the gas supply pipe 27a to the slit nozzle 64, and the $N_2$ gas is sprayed on the surface of the wafer W, so that water adhering to the surface of the wafer W. i.e., the droplets of the cleaning solution L, can be removed. In this case, if the $N_2$ gas is sprayed on the wafer W on the side facing the cleaning solution L as shown in FIG. 6, the cleaning solution L adhering to the surface of the wafer W due to surface tension can be peeled off to be removed, so that the wafer W can be efficiently dried. Since the gas containing water removed from the surface of the wafer W is exhausted to the outside via the exhaust port 29, water does not adhere to the surface of the wafer W again.

Figure 7:
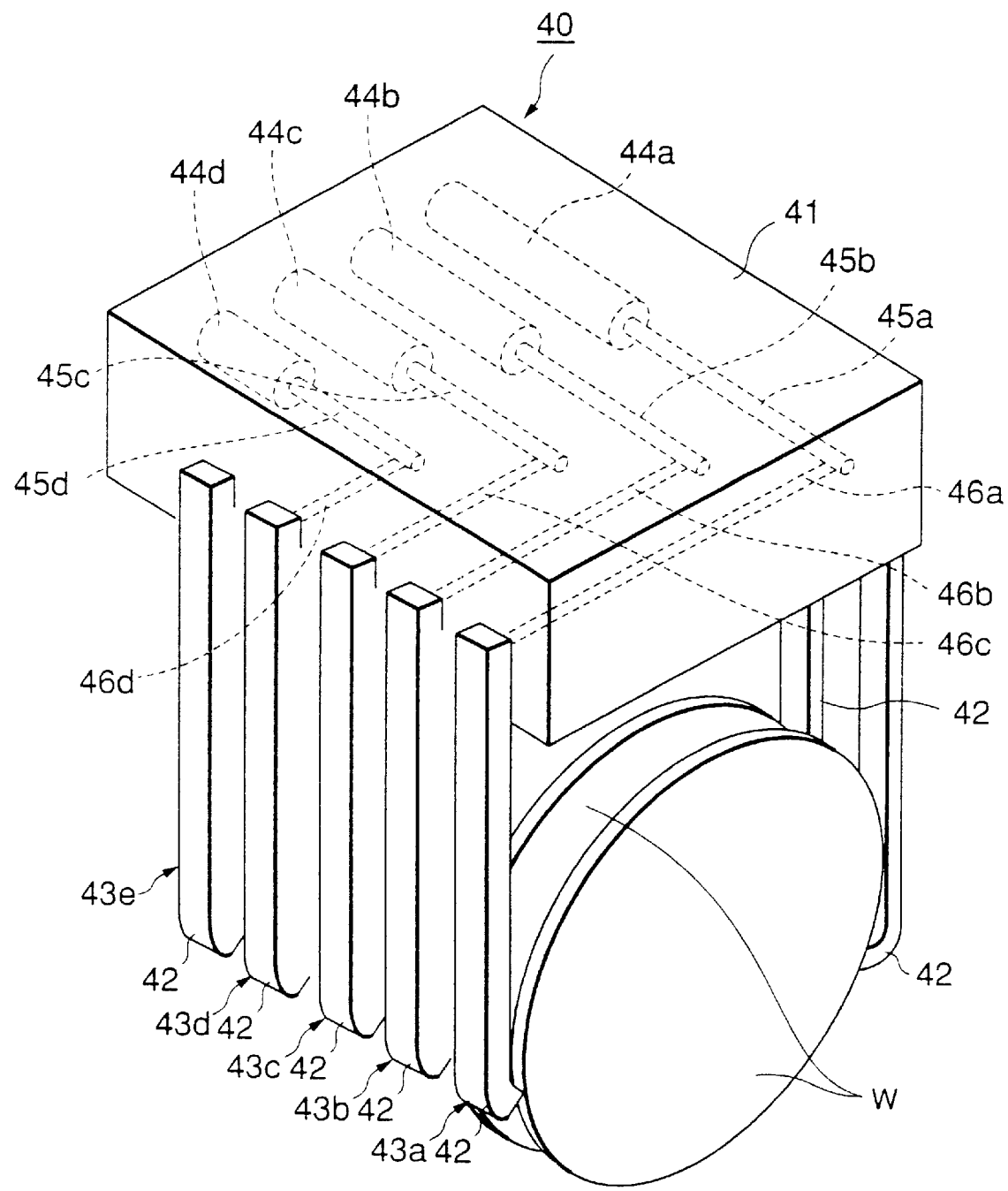
FIG. 7 is a schematic perspective view of a pickup pincette of the second preferred embodiment of a drying system according to the present invention.

As shown in FIG. 7, the pickup pincette 40 comprises: a drive part 41 which is vertically moved by lifter means (not shown); a plurality of pickup claws, e.g., five sets of pickup claws 43a through 43e, each set of which comprises a pair of pickup claw pieces 42 mounted on the drive part 41 for holding each of the wafers W; and a plurality of space adjusting cylinders, e.g., first through fourth space adjusting cylinders 44a through 44d, provided in the drive part 41 for relatively moving each of the pickup claw pieces 42.

Figure 8:
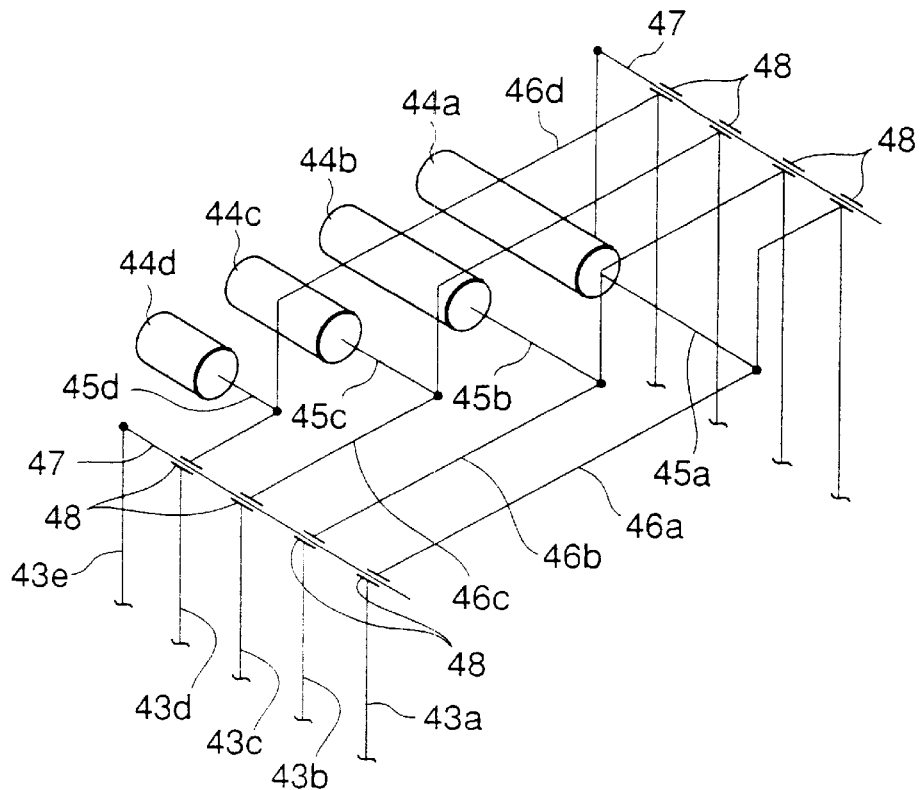
FIG. 8 is a schematic diagram of a space adjusting mechanism for the pickup claws of the pickup pincette.

As shown in FIG. 8, the first pickup claw 43a on the tip side is connected to the first cylinder 44a via a first crank-like connecting rod 46a connected to a piston rod 45a of the first cylinder 44a, which expands and contracts in the longest stroke, and is slidably mounted on guides 47 which have sliders 48 and which are provided on both sides of the drive part 41. The second pickup claw 43b adjacent to the first pickup claw 43a is connected to a piston rod 45b of the second cylinder 44b via a second connecting rod 46b, which is bent in the form of a crank so as not interfere with the first piston rod 45a, and slidably mounted on the guides 47 with the sliders 48. The third pickup claw 43c adjacent to the second pickup claw 43b is connected to a piston rod 45c of the third cylinder 44c via a third connecting rod 46c, which is bent in the form of a crank so as not interfere with the first and second piston rods 45a and 45b, and slidably mounted on the guides 47 with the sliders 48. The fourth pickup claw 43d adjacent to the third pickup claw 43c is connected to a piston rod 45d of the fourth cylinder 44d, which expands and contracts in the shortest stroke, via a fourth connecting rod 46d, which is bent in the form of a crank so as not interfere with the first through third piston rods 45a through 45c, and slidably mounted on the guides 47 with the sliders 48. The fifth pickup claw 43e is fixed on both sides of the drive part 41.

Figures 9A, 9B:
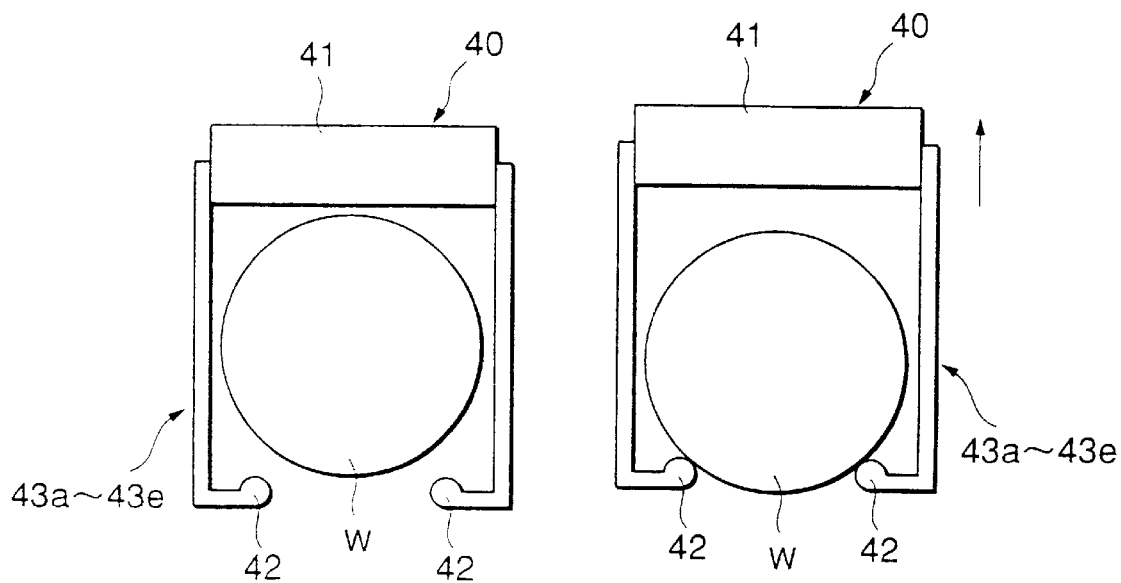
FIGS. 9a and 9b are schematic side views showing the state of wafers picked up by the pickup pincette.

The space adjusting mechanism has the above described construction. Thus, the minimum pitches of the respective pickup claws 43*a* through 43*e*, i.e., the spaces between the adjacent wafers W held by the wafer guides 47, can be even by contracting the first through fourth space adjusting cylinders 44*a* through 44*d*, and each of the spaces between the respective pickup claws 43*a* through 43*e* can be expanded to a predetermined dimension, i.e., a dimension capable of receiving the adjacent pair of vibration transmitting members 62 of the vibration transmitting means 60, by extending the first through fourth cylinders 44*a* through 44*d* to the maximum length. That is, as shown in FIG. 9(*a*), a plurality of wafers, e.g., 5 wafers W, which are held on the tip side by the holding portions of the pickup claws 43*a* through 43*e* held by the wafer introducing guide 34, are moved downwards while maintaining the respective pickup claws 43*a* through 43*e* at the minimum pitch, and as shown in FIG. 9(*b*), the drive part 41 moves upwards, so that the respective sets of pickup claws 43*a* through 43*e* lift the wafers W up from the wafer introducing guide 34 while holding the wafers W. Then, as described above, the first through fourth cylinders 44*a* through 44*d* extend to expand the spaces between the wafers W.

Figure 10:
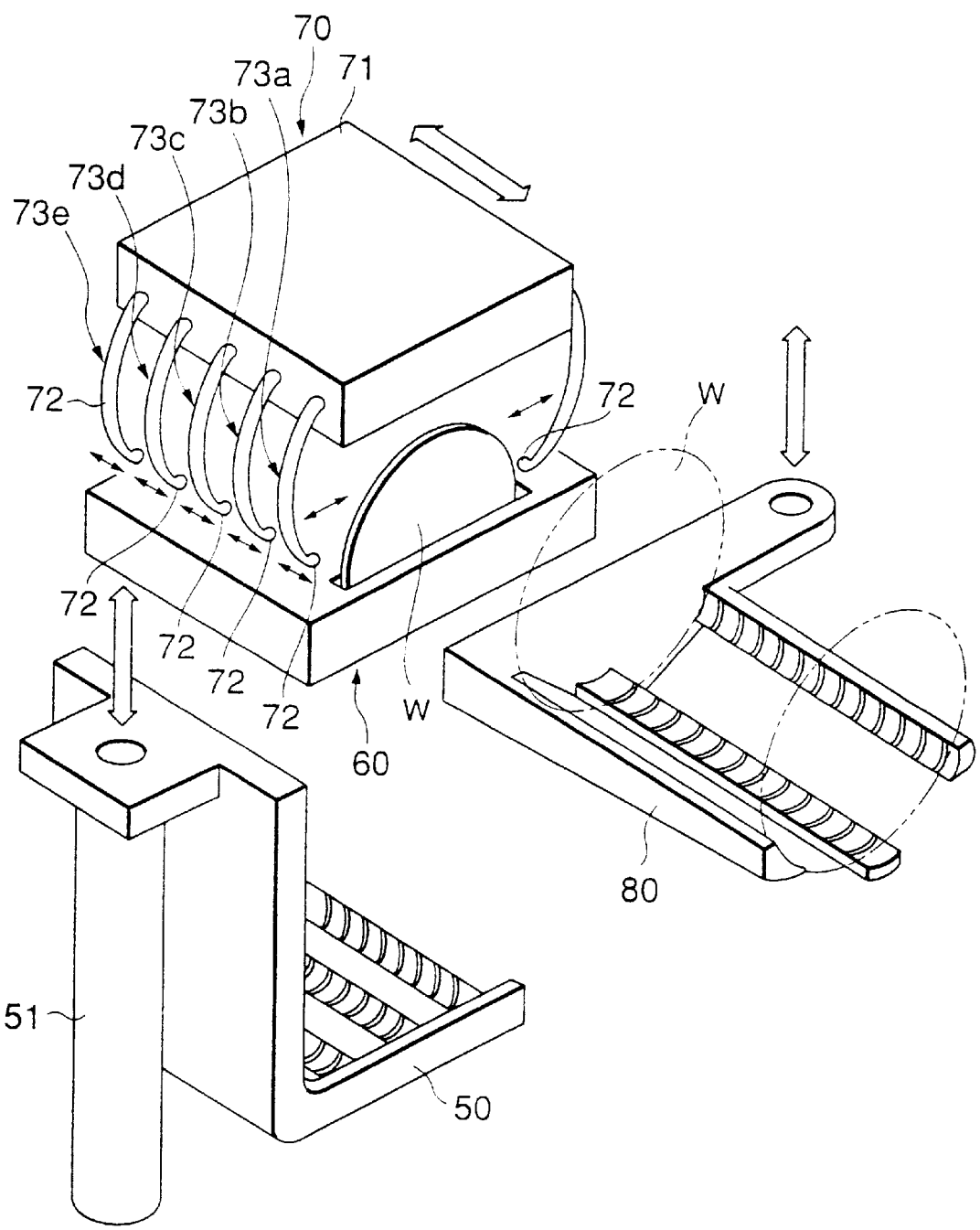
FIG. 10 is a schematic perspective view showing a lift guide, a receiving pincette and a wafer transporting guide in the second preferred embodiment of a drying system according to the present invention.

As shown in FIG. 10, the lift guide 50 is capable of being lifted by lift means, e.g., a lifting cylinder 51. The lift guide 50 receives a plurality of wafers, e.g., 5 wafers W, the spaces between the wafers W having been expanded by the pickup pincette 40, from the pickup pincette 40, and lifts the received wafers W up from the cleaning solution L toward the vibration transmitting means 60. The wafers W lifted up by the lift guide 50 are dried with a gas, e.g., $N_2$ gas, to which ultrasonic vibrational energy has been applied by the vibration transmitting means 60 as described above, when passing through the vibration transmitting means 60 while the pair of vibration transmitting members 62 of the vibration transmitting means 60 are inserted between the adjacent wafers W.

Figure 11:
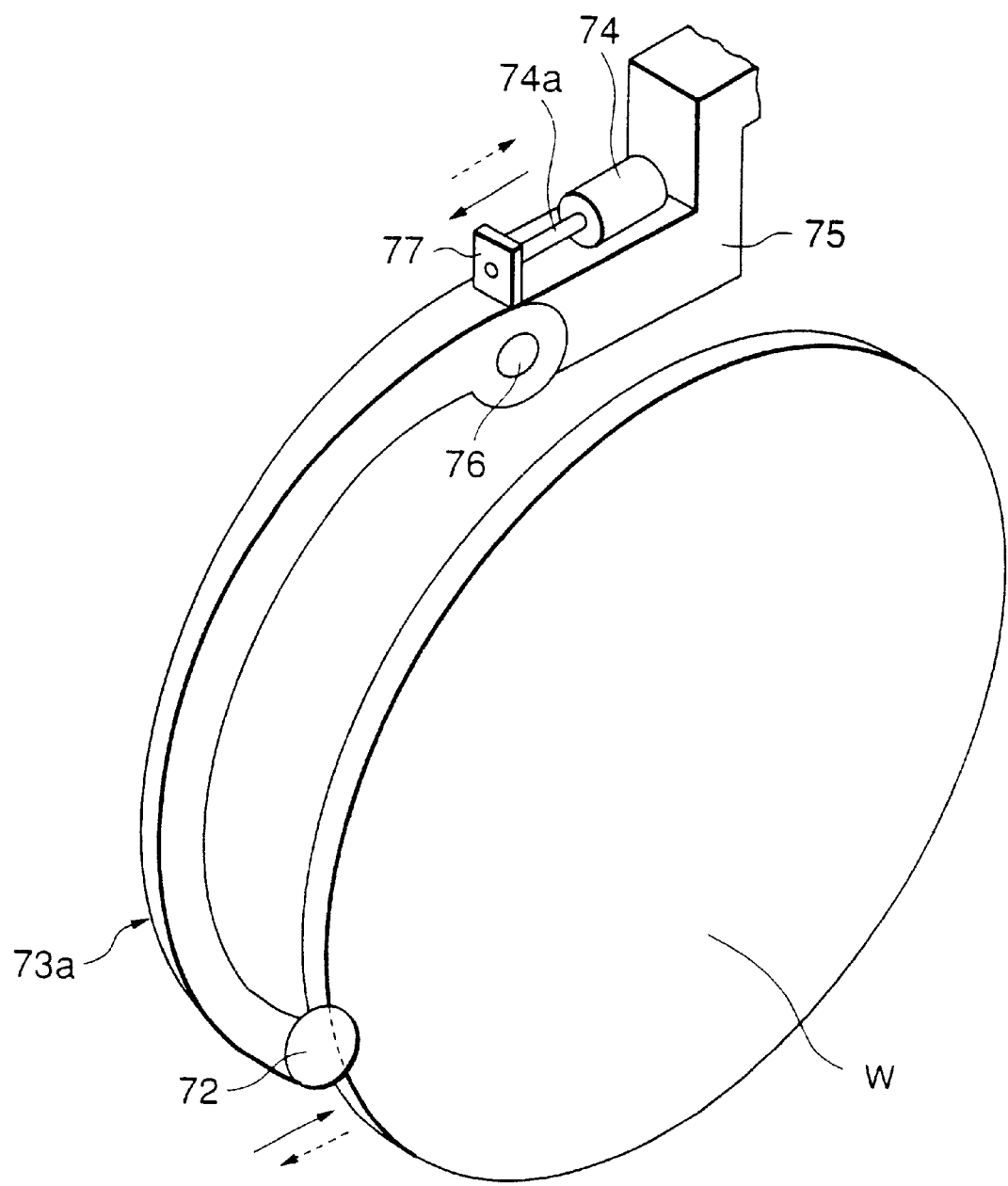
FIG. 11 is a schematic enlarged perspective view showing the operation state of the pickup claw of the receiving pincette, which enlarges part A of FIG. 10.

As shown in FIGS. 10 and 11, the receiving pincette 70 comprises: a moving part 71 which is movable in horizontal directions above the vibration transmitting means 60 by moving means (not shown); a plurality of pickup claws, e.g., five sets of pickup claws 73*a* through 73*e*, each set of which comprises a pair of pickup claw pieces 72 mounted on the moving part 71 for holding each of the wafers W; and switching cylinders 74, each of which is mounted on the moving part 71 for selectively moving a corresponding one of the pickup claws 73*a* through 73*e* between a holding position, at which the wafer W is held, and a non-holding position, at which the wafer W is not held. As shown in FIG. 11, each of the pickup claw pieces 72 of each of the pickup claws 73*a* through 73*e* is mounted on a bracket 75, which projects from the moving part 71, by means of a pivot pin 76 so as to be rotatable in vertical directions around the pivot pin 76. When the piston rods 74*a* of the switching cylinders 74 mounted on the brackets 75 are connected to mounting portions 77 projecting from the pivot portions of the pickup claw pieces 72, the pickup claws 73*a* through 73*e* are moved toward the wafers W from the side of the wafers W in accordance with the extension of the switching cylinders 74, so that the wafers W are held by the pairs of pickup claws 73*a* through 73*e*. Out of the sets of pickup claws 73*a* through 73*e*, the sets of pickup claws other than one set of base end side pickup claw, i.e., four sets of pickup claws 73*a* through 73*d* other than the pickup claw 73*e*, have a space adjusting mechanism similar to the pickup pincette 40. That is, four space adjusting cylinders (not shown) having different strokes can adjust the spaces between the adjacent two of the five wafers W received from the lift guide 50, so as to be the original spaces, i.e., the spaces held by the wafer transport arm 15 and the wafer introducing guide 34.

According to the receiving pincette 70 with the above described construction, while the switching cylinders 74 are contracted to open the pickup claws 73*a* through 73*e*, the moving part 71 is moved above the variable transmitting means 60, and the pickup claws 73*a* through 73*e* are positioned on the side of a plurality of dried wafers, e.g., five dried wafers W passing through the vibration transmitting means 60. Thereafter, the switching cylinders 74 are extended, so that the wafers W can be clamped by the pickup claws 73*a* through 73*e*. Then, after the space adjusting cylinder (not shown) is contracted so that the spaces between the pickup claws 73*a* through 73*e* are narrowed to the original spaces, the moving part 71 can be delivered to the wafer discharging guide 47.

A process for cleaning and drying wafers W using the second preferred embodiment of a drying system according to the present invention will be described below.

First, a plurality of wafers, e.g., 50 wafers W, which have been transported to the treatment section 3 by means of the wafer transport arm 15, are received by the wafer introducing guide 34. After the wafer introducing guide 34 having received the wafers W moves rearwards, the wafer introducing guide 34 moves downwards to immerse the wafers W in the cleaning solution L stored in the treatment bath 21, so that the wafers W are cleaned.

After the cleaning, the pickup pincette 40 picks up a plurality of wafers, e.g., five wafers W, on the front side of the wafer introducing guide 34, and expands the spaces between the wafers W by, e.g., 30 mm, to deliver the wafers W to the lift guide 50. The pickup pincette 40 having delivered the wafers W to the lift guide 50 moves toward the wafer introducing guide 34 again. Then, the pickup pincette 40 similarly picks up the five wafers W and expands the spaces. On the other hand, the lift guide 50 having received the wafers W from the pickup pincette 40 moves upwards while holding the wafers W, the spaces between the wafers W having been expanded, and the wafers W pass through the vibration transmitting means 60 while allowing the vibration transmitting means 60 to be inserted into gaps between the adjacent wafers W.

When the wafers W pass through the vibration transmitting means 60, the vibration transmitting members 62 of the vibration transmitting means 60 are vibrated by means of the oscillator. In addition, a gas, e.g., $N_2$ gas, is supplied from the $N_2$ gas supply source, and ultrasonic vibrational energy is applied to the $N_2$ gas flowing through the slit nozzle 64 via the gas passage 65 from the gas supply pipe 27*a*. Thus, the $N_2$ gas is sprayed on the surface of the wafer W from the slit nozzle 64 to remove water, i.e., the droplets of the cleaning solution L, adhering to the surface of the wafer W, so that the wafers W are dried. At this time, a suction pump (not shown) is driven, and the gas containing water removed from the surface of the wafer W is exhausted to the outside via both of the facing exhaust ports 29. In addition, it is possible to more improve drying efficiency by heating the $N_2$ gas.

As described above, after the wafers W having passed through the vibration transmitting means 60 to be dried are picked up by the receiving pincette 70 to narrow the spaces to the original spaces, the wafers W are delivered to the wafer discharging guide 80. After the wafers W are delivered to the wafer discharging guide 80, the receiving pincette 70 similarly picks up the next five wafers W and narrows the spaces to deliver the wafers W to the wafer discharging guide 80.

After the 50 wafers cleaned by sequentially repeating the above described procedure are delivered to the wafer discharging guide 80, the wafers W are delivered from the wafer discharging guide 80 to the wafer transport arm 15, and transported to the interface section 4 by means of the wafer transport arm 15.

Furthermore, in the above described preferred embodiments, while the vibration transmitting means 60 have transmitted ultrasonic vibration, the present invention should not be limited thereto, but low frequency vibration transmitting means for transmitting a vibration having a lower frequency (e.g., a frequency of several Hz through several KHz) than an ultrasonic vibration (having a frequency of, e.g., about 20 KHz or more). In addition, any one of the ultrasonic vibration and the vibration having the lower frequency than the ultrasonic vibration may be transmitted, or both of the vibrations may be transmitted.

In addition, in the above described preferred embodiments, while the drying system and method according to the present invention have been applied to a method for cleaning and drying semiconductor wafers, the present invention may be applied to other substrates than the semiconductor wafers, e.g., glass substrates for LCDs.

Moreover, while the drying system and method according to the present invention have been introduced into a system for cleaning and drying semiconductor wafers to be used as a part of the system as described above in the preferred embodiments, the present invention should not be limited thereto, but it may be used as a unit.

According to the present invention, the following excellent advantages can be obtained.

(1) It is possible to remove water adhering to the surfaces of cleaned objects to be treated, to dry the objects by applying ultrasonic or low frequency vibrational energy to a gas in vicinity of the surfaces of the cleaned objects.

(2) It is possible to remove water adhering to the surfaces of objects to be treated, to dry the objects by applying an ultrasonic or low frequency vibration to vibration transmitting means using vibration generating means and by applying ultrasonic or low frequency vibrational energy to a gas between the vibration transmitting means and the surfaces of the objects while moving means causes the surfaces of the objects to approach the vibration transmitting means. Therefore, it is possible to more improve drying efficiency in addition to the above described advantage (1).

(3) It is possible to remove water adhering to the surfaces of objects to be treated, to dry the objects by applying an ultrasonic or low frequency vibration to a vibration transmitting means using vibration generating means and by applying ultrasonic or low frequency vibrational energy to a gas between the vibration transmitting means and the surfaces of the objects when the objects, which have been immersed in a cleaning solution to be cleaned, are pulled up from the cleaning solution. Therefore, it is possible to quickly dry the cleaned objects in addition to the above described advantage (1).

(4) Since it is possible to remove water adhering to the surfaces of objects to be treated, by applying ultrasonic or low frequency vibrational energy to a gas which is positively supplied toward the surfaces of the objects, it is possible to more improve drying efficiency in addition to the above described advantage (1). In this case, since it is possible to remove water so as to peel off the surfaces of the objects by spraying the gas toward the liquid surfaces on the objects pulled up from a cleaning solution, it is possible to more surely remove water adhering to the surfaces of the objects.

(5) Since a gas containing the removed water is exhausted by exhaust means, it is possible to prevent the removed water from adhering to the objects again, in addition to the above described advantage (1).

(6) Since it is possible to adjust spaces between a plurality of objects to be treated, to cause vibration transmitting means to enter and approach the spaces between the objects by providing a space adjusting mechanism for adjusting the spaces between the objects on receiving means provided on holding means or on grabbing means, it is possible to simultaneously dry the plurality of objects. Therefore, it is possible to sequentially dry the plurality of objects in addition to the above described advantages (1) through (3).

(7) Since it is possible to remove water adhering to the surfaces of objects to be treated, by supplying a gas, which has been heated by heating means, to spaces between the objects and vibration transmitting means and by applying ultrasonic or low frequency vibrational energy to the heated gas, it is possible to further improve drying efficiency in addition to the above described advantage (1).

(8) Since the vibration transmitting means can be integrally formed with the supply port of the air supply means, it is possible to positively supply the gas toward the surfaces of the objects and it is possible to reduce the size of the system.

(9) If the vibration transmitting means has a pair of vibration transmitting members arranged between objects to be treated, each of the vibration transmitting members having an inclined surface on the side opposite the object so that the inclined surface extending toward the end thereof is inclined toward the object, and if exhaust ports communicating with exhaust means are formed between the adjacent vibration transmitting members, it is possible to integrally form the vibration transmitting means and the exhaust ports of the exhaust means. Therefore, it is possible to quickly exhaust the gas containing the removed water and it is possible to reduce the size of the system.

(10) If the spaces between the adjacent two of a plurality of cleaned objects to be treated are expanded to predetermined spaces to insert vibration transmitting means into the spaces between the objects to supply a gas to the spaces between the objects and the vibration transmitting means, and if ultrasonic or low frequency vibrational energy is applied to the gas by the vibration of the vibration transmitting means to remove water adhering to the surface of the object, it is possible to remove water adhering to the surfaces of the plurality of objects by applying the ultrasonic or low frequency vibrational energy to the supplied gas while ensuring the spaces for receiving the vibration transmitting means between the plurality of objects.

(11) It is possible to prevent the removed water from adhering to the objects again by exhausting the gas containing the removed water after removing water adhering to the surface of the object.

(12) If the spaces between the adjacent two of a plurality of cleaned objects to be treated are expanded to predetermined spaces to move the objects so that vibration transmitting means are positioned between the plurality of objects, and if a gas is supplied to the spaces between the objects and the vibration transmitting means and ultrasonic or low frequency vibrational energy is applied to the gas by the vibration of the vibration transmitting means, it is possible to remove water adhering to the surfaces of the objects and it is possible to exhaust the gas containing the removed water. Moreover, after the plurality of objects, from which water has been removed and which has been dried, are clamped and the spaces between the objects are narrowed to predetermined spaces, it is possible to discharge the objects to a predetermined place.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A drying system for removing water adhering to a surface of a cleaned object to be treated, said drying system comprising:

holding means for holding said object;

vibration transmitting means capable of approaching said surface of said object; and vibration generating means for applying an ultrasonic vibration or a low frequency vibration having a lower frequency than that of said ultrasonic vibration to said vibrating transmitting means, said vibration generating means applying said ultrasonic vibration or said low frequency vibration to said vibration transmitting means, and applying energy of said ultrasonic vibration or said low frequency vibration to a gas between said vibration transmitting means and said surface of said object to remove water adhering to said surface of said object.

2. A drying system for removing water adhering to surfaces of a plurality of cleaned objects to be treated, said drying system comprising:

vibration transmitting means capable of approaching said surfaces of said plurality of objects;

vibration generating means for applying an ultrasonic vibration or a low frequency vibration having a lower frequency than that of said ultrasonic vibration to said vibration transmitting means;

holding means for holding said plurality of objects at regular intervals; and moving means for relatively moving said vibration transmitting means and said holding means, wherein while said moving means causes said surfaces of said plurality of objects to approach said vibration transmitting means, said vibration generating means applies said ultrasonic vibration or said low frequency vibration to said vibration transmitting means, and applies energy of said ultrasonic vibration or said low frequency vibration to a gas between said vibration transmitting means and said surfaces of said plurality of objects to remove water adhering to said surfaces of said plurality of objects.

3. A drying system for removing water adhering to surfaces of a plurality of cleaned objects to be treated, said drying system comprising:

vibration transmitting means arranged above a cleaning section for cleaning said plurality of objects, said vibration transmitting means being capable of approaching said surfaces of said plurality of objects pulled up from said cleaning section;

vibration generating means for applying an ultrasonic vibration or a low frequency vibration having a lower frequency than that of said ultrasonic vibration to said vibration transmitting means;

holding means for holding said plurality of objects at regular intervals; and moving means for relatively moving said vibration transmitting means and said holding means so that said plurality of objects pass through said vibration transmitting means, wherein when said moving means pulls said plurality of objects up from said cleaning section to cause said plurality of objects to pass through said vibration transmitting means, said vibration generating means applies said ultrasonic vibration or said low frequency vibration to said vibration transmitting means, and applies energy of said ultrasonic vibration or said low frequency vibration to a gas between said vibration transmitting means and said surfaces of said plurality of objects to remove water adhering to said surfaces of said plurality of objects.

4. A drying system for removing water adhering to surfaces of a plurality of cleaned objects to be treated, said drying system comprising:

vibration transmitting means capable of approaching said surfaces of said plurality of objects;

vibration generating means for applying an ultrasonic vibration or a low frequency vibration having a lower frequency than that of said ultrasonic vibration to said vibration transmitting means;

holding means for holding said plurality of objects at regular intervals; and moving means for relatively moving said vibration transmitting means and said holding means so that said plurality of objects pass through said vibration transmitting means;

grabbing means for grabbing said plurality of objects which have been passed through said vibration transmitting means; and discharge means for receiving said plurality of objects from said grabbing means to discharge said plurality of objects to a predetermined place, wherein while said moving means causes said surfaces of said plurality of objects to pass through said vibration transmitting means, said vibration generating means applies said ultrasonic vibration or said low frequency vibration to said vibration transmitting means, and applies energy of said ultrasonic vibration or said low frequency vibration to a gas between said vibration transmitting means and said surfaces of said plurality of objects to remove water adhering to said surfaces of said plurality of objects.

5. A drying system as set forth in any one of claims 1 through 4, which further comprises gas supply means for supplying a gas to spaces between said objects and said vibration transmitting means, said vibration generating means applying said ultrasonic vibration or said low frequency vibration to said vibration transmitting means, and applying energy of said ultrasonic vibration or said low frequency vibration to a gas supplied by said gas supply means to the spaces between said vibration transmitting means and said surfaces of said objects to remove water adhering to said surfaces of said objects.

6. A drying system as set forth in any one of claims 1 through 4, which further comprises:

gas supply means for supplying a gas to spaces between said objects and said vibration transmitting means, and exhaust means having an exhaust port at a position at which said object approaches said vibration transmitting means, said vibration generating means applying said ultrasonic vibration or said low frequency vibration to said vibration transmitting means, and applying energy of said ultrasonic vibration or said low frequency vibration to a gas supplied by said gas supply means to the spaces between said vibration transmitting means and said surfaces of said objects to remove water adhering to said surfaces of said objects and to exhaust the gas containing water removed by said exhaust means.

7. A drying system as set forth in claim 3 or 4, which further comprises delivering means for delivering said objects to said holding means, said delivering means having a space adjusting mechanism for adjusting the spaces between said objects.

8. A drying system as set forth in claim 4, wherein said grabbing means has a space adjusting mechanism for adjusting the spaces between said objects.

9. A drying system as set forth in claim 5, which further comprises heating means for heating the gas supplied from said gas supply means, said gas heated by said heating means being supplied to the spaces between said object and said vibration transmitting means.

10. A drying system as set forth in claim 5, wherein said vibration transmitting means has a gas supply port for said gas supplying means.

11. A drying system as set forth in claim 6, wherein said vibration transmitting means has a pair of vibration transmitting members arranged between said objects, each of said vibration transmitting members having an inclined surface on the opposite surface to a surface facing each of the surfaces of the objects so that said inclined surface extending toward the tip thereof is inclined toward the corresponding one of the objects, and an exhaust port communicating with said exhaust means being formed between the adjacent vibration transmitting members.

12. A drying method for removing water adhering to a surface of a cleaned object to be treated, wherein energy of an ultrasonic vibration or a low frequency vibration having a lower frequency than that of said ultrasonic vibration is applied to a gas near said surface of said object to remove water adhering to said surface of said object.

13. A drying method comprising the step of:

immersing an object to be treated, in a cleaning solution;

relatively pulling said object up from said cleaning solution;

applying energy of an ultrasonic vibration or a low frequency vibration having a lower frequency than that of said ultrasonic vibration to a gas near said surface of said object to remove water adhering to said surface of said object.

14. A drying method as set forth in claim 12 or 13, wherein said gas is supplied toward said surface of said object, and said energy of said ultrasonic vibration or said low frequency vibration is applied to said gas to remove water adhering to said surface of said object.

15. A drying method as set forth in claim 14, wherein said gas is sprayed toward a liquid surface on said object pulled up from a cleaning solution.

16. A drying method as set forth in claim 12 or 13, which further comprises the steps of:

inserting vibration transmitting means into spaces between the cleaned objects; and applying energy of said ultrasonic or low frequency vibration to a gas by the vibration of said vibration transmitting means to remove water adhering to the surfaces of said objects.

17. A drying method as set forth in claim 12 or 13, which further comprises the steps of:

inserting vibration transmitting means into spaces between the cleaned objects;

supplying a gas to spaces between said objects and said vibration transmitting means; and applying energy of said ultrasonic or low frequency vibration to said gas by the vibration of said vibration transmitting means to remove water adhering to the surfaces of said objects.

18. A drying method as set forth in claim 12 or 13, which further comprises the steps of:

inserting vibration transmitting means into spaces between the cleaned objects;

supplying a gas to spaces between said objects and said vibration transmitting means;

applying energy of said ultrasonic or low frequency vibration to said gas by the vibration of said vibration transmitting means to remove water adhering to the surfaces of said objects; and exhausting the gas containing water removed from said objects.

19. A drying method for removing water adhering to surfaces of a plurality of cleaned objects to be treated, said drying method comprising the steps of:

expanding spaces between said plurality of cleaned objects to be treated, to predetermined spaces;

inserting vibration transmitting means into said spaces between the cleaned objects;

supplying a gas to spaces between said objects and vibration transmitting means; and applying energy of an ultrasonic vibration or a low frequency vibration having a lower frequency than that of said ultrasonic vibration to said gas by the vibration of said vibration transmitting means to remove water adhering to the surfaces of said objects.

20. A drying method for removing water adhering to surfaces of a plurality of cleaned objects to be treated, said drying method comprising the steps of:

expanding spaces between said plurality of cleaned objects to be treated, to predetermined spaces;

inserting vibration transmitting means into said spaces between the cleaned objects;

supplying a gas to spaces between said objects and vibration transmitting means;

applying energy of an ultrasonic vibration or a low frequency vibration having a lower frequency than that of said ultrasonic vibration to said gas by the vibration of said vibration transmitting means to remove water adhering to the surfaces of said objects; and exhausting the gas containing water removed from said objects.

21. A drying method for removing water adhering to surfaces of a plurality of cleaned objects to be treated, said drying method comprising the steps of:

expanding spaces between said plurality of cleaned objects to be treated, to predetermined spaces;

passing said objects through vibration transmitting means to position said vibration transmitting means between said plurality of objects;

supplying a gas to spaces between said objects and said vibration transmitting means when said objects pass through said vibration transmitting means;

applying energy of an ultrasonic vibration or a low frequency vibration having a lower frequency than that of said ultrasonic vibration to said gas by the vibration of said vibration transmitting means to remove water adhering to the surfaces of said objects;

exhausting the gas containing water removed from said objects;

grabbing said plurality of objects, from which water has been removed and which have been dried, and narrowing spaces between said plurality of objects to predetermined spaces; and discharging said plurality of objects, the spaces between said objects having been narrowed.

22. A dying method as set forth in any one of claims 12, 13, 19, 20 and 21, wherein said gas is a gas heated to a predetermined temperature.

23. A drying system as set forth in claim 2, wherein
said vibration transmitting means has a plurality of vibration transmitting members spaced from each other, each of said objects being placed between a pair of vibration transmitting members while said moving means causes said surfaces of said plurality of objects to approach said vibration transmitting means.

* * * * *